United States Patent
Lin et al.

(10) Patent No.: US 10,672,338 B2
(45) Date of Patent: Jun. 2, 2020

(54) ORGANIC LIGHT-EMITTING DIODE DISPLAY WITH EXTERNAL COMPENSATION AND ANODE RESET

(71) Applicant: Apple Inc., Cupertino, CA (US)

(72) Inventors: Chin-Wei Lin, San Jose, CA (US); Shinya Ono, Cupertino, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/802,367

(22) Filed: Nov. 2, 2017

(65) Prior Publication Data

US 2018/0277037 A1    Sep. 27, 2018

Related U.S. Application Data

(60) Provisional application No. 62/476,562, filed on Mar. 24, 2017.

(51) Int. Cl.
*G09G 3/325* (2016.01)
*G09G 3/3258* (2016.01)
(Continued)

(52) U.S. Cl.
CPC .............. *G09G 3/325* (2013.01); *G06F 3/044* (2013.01); *G06F 3/0412* (2013.01); *G06F 3/0416* (2013.01); *G09G 3/3233* (2013.01); *G09G 3/3258* (2013.01); *G09G 3/3275* (2013.01); *G09G 3/3291* (2013.01); *H01L 27/3258* (2013.01); *G09G 2300/043* (2013.01); *G09G 2300/0819* (2013.01); *G09G 2300/0842* (2013.01); *G09G 2300/0861* (2013.01);
(Continued)

(58) Field of Classification Search
CPC ...... G06F 3/0412; G06F 3/0416; G06F 3/044; G09G 2300/043; G09G 2300/0819; G09G 2300/0842; G09G 2300/0861; G09G 2310/0251; G09G 2310/0262; G09G 2310/0289; G09G 2310/061; G09G 2320/0285; G09G 3/3233; G09G 3/325; G09G 3/3258; G09G 3/3275; G09G 3/3291; H01L 27/3258; H01L 51/0508; H01L 27/3276; H01L 27/3262; H05B 33/0896

See application file for complete search history.

(56) References Cited

U.S. PATENT DOCUMENTS

| | | | |
|---|---|---|---|
| 8,237,634 B2 | 8/2012 | Kwak | |
| 9,202,414 B2 | 12/2015 | Hu et al. | |
| 9,208,725 B2 | 12/2015 | Guo et al. | |
| 2014/0347253 A1* | 11/2014 | Lee | H05B 33/0896 345/76 |
| 2015/0123883 A1* | 5/2015 | Lin | G09G 3/3233 345/76 |

(Continued)

*Primary Examiner* — Richard J Hong

(74) *Attorney, Agent, or Firm* — Treyz Law Group, P.C.; Jason Tsai

(57) ABSTRACT

A display may include an array of organic light-emitting diode display pixels having transistors characterized by threshold voltages subject to transistor variations. Compensation circuitry may be used to measure a transistor threshold voltage for a pixel. The threshold voltage may be sampled by controlling the pixel to sample the threshold voltage onto a capacitor at the pixel. The pixel may include at least one semiconducting-oxide transistor, silicon transistors, and a light-emitting diode. The diode may be coupled to a data line that can be used for both data loading and compensation sensing operations. Reset operations may be performed after data programming and before emission to reset the anode voltage for the diode.

20 Claims, 10 Drawing Sheets

(51) Int. Cl.
*G09G 3/3291* (2016.01)
*G06F 3/041* (2006.01)
*G06F 3/044* (2006.01)
*H01L 27/32* (2006.01)
*G09G 3/3233* (2016.01)
*G09G 3/3275* (2016.01)

(52) U.S. Cl.
CPC ............... *G09G 2310/0251* (2013.01); *G09G 2310/0262* (2013.01); *G09G 2310/0289* (2013.01); *G09G 2310/061* (2013.01); *G09G 2320/0285* (2013.01); *H01L 27/3262* (2013.01); *H01L 27/3276* (2013.01)

(56) References Cited

U.S. PATENT DOCUMENTS

| | | | |
|---|---|---|---|
| 2015/0294626 A1* | 10/2015 | Bi | G09G 3/3233 345/211 |
| 2015/0364084 A1 | 12/2015 | Gu et al. | |
| 2016/0063921 A1* | 3/2016 | Tsai | G09G 3/3233 345/76 |
| 2016/0063922 A1 | 3/2016 | Tsai et al. | |
| 2016/0098961 A1* | 4/2016 | Han | G09G 3/3291 345/691 |
| 2016/0267844 A1* | 9/2016 | Senda | G09G 3/3233 |
| 2016/0329017 A1 | 11/2016 | Chaji et al. | |
| 2017/0083163 A1* | 3/2017 | Liu | G06F 3/0412 |
| 2017/0243537 A1* | 8/2017 | Wu | G09G 3/3233 |
| 2017/0270853 A1* | 9/2017 | Xiang | G09G 3/3275 |
| 2018/0006263 A1* | 1/2018 | Yoon | H01L 51/0508 |

\* cited by examiner

ORGANIC LIGHT-EMITTING DIODE DISPLAY WITH EXTERNAL COMPENSATION AND ANODE RESET

This application claims the benefit of provisional patent application No. 62/476,562, filed on Mar. 24, 2017, which is hereby incorporated by reference herein in its entirety.

BACKGROUND

This relates generally to electronic devices with displays and, more particularly, to display driver circuitry for displays such as organic-light-emitting diode displays.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode to produce light.

An organic light-emitting diode display pixel includes a drive thin-film transistor connected to a data line via an access thin-film transistor. The access transistor may have a gate terminal that receives a scan signal via a corresponding scan line. Image data on the data line can be loaded into the display pixel by asserting the scan signal to turn on the access transistor. The display pixel includes a current source transistor that provides current to the organic light-emitting diode to produce light.

Transistors in an organic light-emitting diode display pixel may be subject to process, voltage, and temperature (PVT) variations. Due to such variations, transistor threshold voltages between different display pixels may vary. Variations in transistor threshold voltages can cause the display pixels to produce amounts of light that do not match a desired image. Compensation schemes are sometimes used to compensate for variations in threshold voltage. Such compensation schemes typically involve sampling operations that are performed within each pixel during normal display operations and thus increase the time required to display images.

It is within this context that the embodiments herein arise.

SUMMARY

An electronic device may include a display having an array of display pixels. The display pixels may be organic light-emitting diode display pixels. Each display pixel may have an organic light-emitting diode that emits light. A drive transistor (i.e., a current source transistor) in each display pixel may apply current to the organic light-emitting diode in that display pixel. The drive transistor may be characterized by a threshold voltage.

The threshold voltage may be subject to transistor variations. Compensation circuitry may be used to measure the threshold voltage of the drive transistor. The threshold voltage may be sampled by controlling the drive transistor to sample the threshold voltage onto a capacitor coupled between gate and source terminals of the current source transistor. The compensation circuitry may include sense circuitry that may be operated in combination with the pixel to transfer charge from the capacitor to the sense circuitry such that the threshold voltage is produced at an output of the sense circuitry. The compensation circuitry may generate compensation data based on the measured threshold voltage.

During display operations, data circuitry may receive digital image data and process the digital image data along with the compensation data to generate analog data signals for the pixel.

Threshold voltage compensation data may be generated for each pixel or for groups of pixels. The compensation data may be stored in memory such as volatile or non-volatile memory. The compensation data may be stored as an offset value (e.g., normalized against a reference threshold voltage). During display operations, data circuitry may add the offset value to the digital image data. The summed digital value may be used in generating analog pixel data signals that compensates for threshold voltage variations between pixels.

The display pixel may also include an emission control transistor (e.g., a transistor that is coupled in series with the drive transistor and the light-emitting diode), a gate voltage setting transistor (e.g., a transistor for setting the gate terminal of the drive transistor to a predetermined reference voltage level), a data loading transistor (e.g., a transistor for loading data into the pixel and also for sensing the threshold voltage of the drive transistor), and an anode resetting transistor (e.g., a transistor for resetting the anode terminal of the light-emitting diode). A data programming operation may be followed by an anode resetting operation. The anode resetting operation can help eliminate the low gray non-uniformity issues, eliminate low refresh rate flicker, and improve variable refresh rate index.

DETAILED DESCRIPTION

Figure 1:
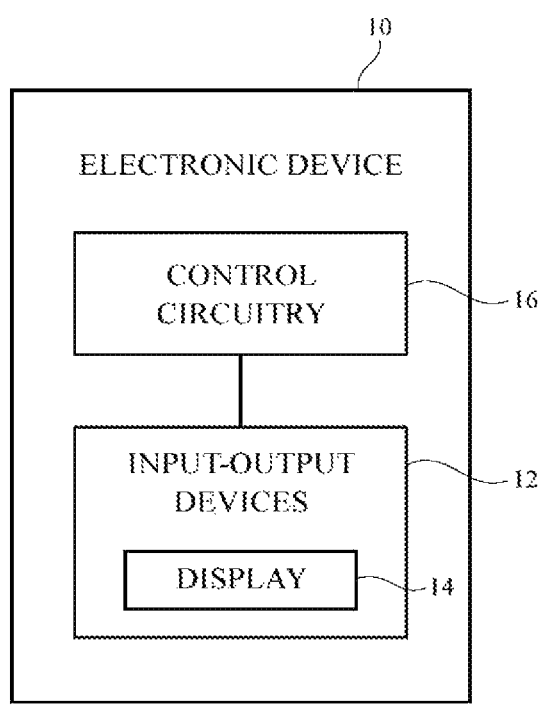
FIG. 1 is a diagram of an illustrative electronic device having a display in accordance with an embodiment.

An illustrative electronic device of the type that may be provided with an organic light-emitting diode (OLED) display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, programmable integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Figure 2:
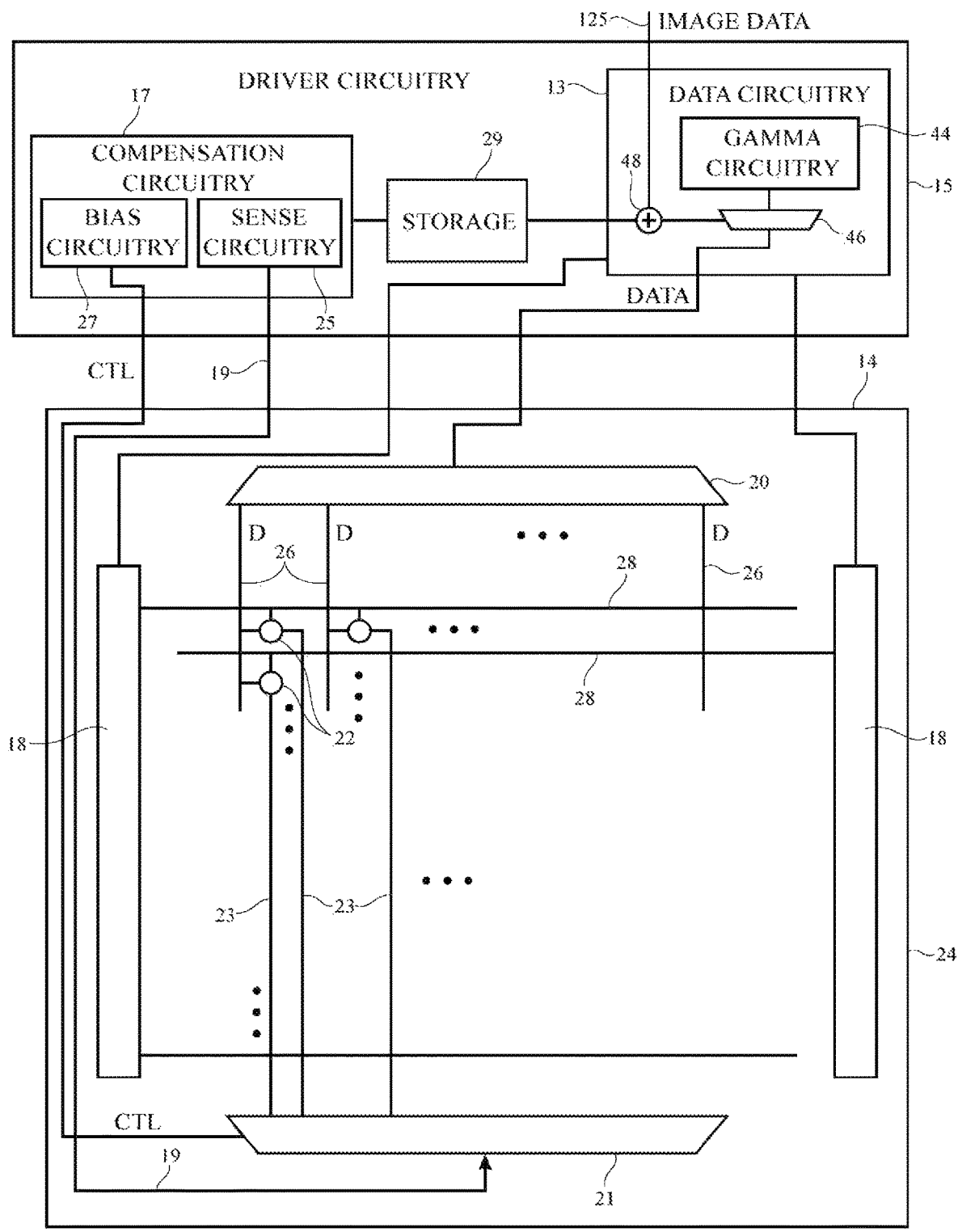
FIG. 2 is a diagram of an illustrative display having an array of organic light-emitting diode display pixels coupled to compensation circuitry in accordance with an embodiment.

FIG. 2 shows display 14 and associated display driver circuitry 15. Display 14 includes structures formed on one or more layers such as substrate 24. Layers such as substrate 24 may be formed from planar rectangular layers of material such as planar glass layers. Display 14 may have an array of display pixels 22 for displaying images to a user. The array of display pixels 22 may be formed from rows and columns of display pixel structures on substrate 24. These structures may include thin-film transistors such as polysilicon thin-film transistors, semiconducting oxide thin-film transistors, etc. There may be any suitable number of rows and columns in the array of display pixels 22 (e.g., ten or more, one hundred or more, or one thousand or more).

Display driver circuitry such as display driver integrated circuit 15 may be coupled to conductive paths such as metal traces on substrate 24 using solder or conductive adhesive. If desired, display driver integrated circuit 15 may be coupled to substrate 24 over a path such as a flexible printed circuit or other cable. Display driver integrated circuit 15 (sometimes referred to as a timing controller chip) may contain communications circuitry for communicating with system control circuitry 16 over path 125. Path 125 may be formed from traces on a flexible printed circuit or other cable. Control circuitry 16 (see FIG. 1) may be located on a main logic board in an electronic device such as a cellular telephone, computer, television, set-top box, media player, portable electronic device, or other electronic equipment in which display 14 is being used.

During operation, the control circuitry may supply display driver integrated circuit 15 with information on images to be displayed on display 14. To display the images on display pixels 22, display driver integrated circuit 15 may supply clock signals and other control signals to display driver circuitry such as row driver circuitry 18 and column driver circuitry 20. For example, data circuitry 17 may receive image data and process the image data to provide pixel data signals to display 14. The pixel data signals may be demultiplexed by column driver circuitry 20 and pixel data signals D may be routed to each pixel 22 over data lines 26 (e.g., to each red, green, or blue pixel). Row driver circuitry 18 and/or column driver circuitry 20 may be formed from one or more integrated circuits and/or one or more thin-film transistor circuits.

Display driver integrated circuit 15 may include compensation circuitry 17 that helps to compensate for variations among display pixels 22 such as threshold voltage variations. Compensation circuitry 17 may, if desired, also help compensate for transistor aging. Compensation circuitry 17 may be coupled to pixels 22 via path 19, switching circuitry 21, and paths 23. Compensation circuitry 17 may include sense circuitry 25 and bias circuitry 27. Sense circuitry 25 may be used in sensing (e.g., sampling) voltages from pixels 22. During sense operations, switching circuitry 21 may be configured to electrically couple sense circuitry 25 to one or more selected pixels 22. For example, compensation circuitry 17 may produce control signal CTL to configure switching circuitry 21. Sense circuitry 25 may sample voltages such as threshold voltages or other desired signals from the pixels over path 19, switching circuitry 21, and paths 23. Bias circuitry 27 may include one or more driver circuits for driving reference or bias voltages onto nodes of pixels 22. For example, switching circuitry 21 may be configured to electrically couple path 19 to one or more selected pixels 22. In this scenario, bias circuitry 27 may provide reference signals to the selected pixels. The reference signals may bias nodes at the selected pixels at desired voltages for the sensing operations performed by sense circuitry 25.

Compensation circuitry 17 may perform compensation operations on pixels 22 using bias circuitry 27 and sense circuitry 25 to generate compensation data that is stored in storage 29. Storage 29 may, for example, be static random access memory (SRAM). In the example of FIG. 2, storage 29 is on-chip storage. If desired, storage 29 may be off-chip storage such as non-volatile storage (e.g., non-volatile memory that maintains stored information even when the display is powered off). The compensation data stored in storage 29 may be retrieved by data circuitry 13 during display operations. Data circuitry 13 may process the compensation data along with incoming digital image data to generate compensated data signals for pixels 22.

Data circuitry 13 may include gamma circuitry 44 that provides a mapping of digital image data to analog data signals at appropriate voltage levels for driving pixels 22. Multiplexer 46 receives a set of possible analog data signals from gamma circuitry 44 and is controlled by the digital image data to select an appropriate analog data signal for the digital image data. Compensation data retrieved from storage 29 may be added to (or subtracted from) the digital image data by adder circuit 48 to help compensate for transistor variations (e.g., threshold voltage variations, transistor aging variations, or other types of variations) between different display pixels 22. This example in which compensation data is added as an offset to digital input image data is merely illustrative. In general, data circuitry 13 may process compensation data along with image data to produce compensated analog data signals for driving pixels 22.

In contrast to techniques that focus on performing in-pixel threshold canceling (such as by performing a reset phase followed by a threshold compensation phase), performing compensation in this way using compensation circuitry 17 outside of each pixel 22 allows for higher refresh rates (e.g., greater than 60 Hz refresh rate, at least 120 Hz refresh rate, etc.) and is sometimes referred to as "external" compensation. External variation compensation may be performed in the factory, in real time (e.g., during blanking intervals between successive image frames), or when the display is idle (as examples).

Row driver circuitry 18 may be located on the left and right edges of display 14, on only a single edge of display 14, or elsewhere in display 14. During operation, row driver circuitry 18 may provide row control signals on horizontal lines 28 (sometimes referred to as row lines, "scan" lines, and/or "emission" lines). Row driver circuitry may include scan line driver circuitry for driving the scan lines and emission driver circuitry for driving the emission lines.

Demultiplexing circuitry 20 may be used to provide data signals D from display driver integrated circuit (DIC) 15 onto a plurality of corresponding vertical lines 26. Demultiplexing circuitry 20 may sometimes be referred to as column driver circuitry, data line driver circuitry, or source driver circuitry. Vertical lines 26 are sometimes referred to as data lines. During display operations, display data may be loaded into display pixels 22 using lines 26.

Each data line 26 is associated with a respective column of display pixels 22. Sets of horizontal signal lines 28 run horizontally through display 14. Each set of horizontal signal lines 28 is associated with a respective row of display pixels 22. The number of horizontal signal lines in each row is determined by the number of transistors in the display pixels 22 that are being controlled independently by the horizontal signal lines. Display pixels of different configurations may be operated by different numbers of scan lines.

Row driver circuitry 18 may assert control signals such as scan and emission signals on the row lines 28 in display 14. For example, driver circuitry 18 may receive clock signals and other control signals from display driver integrated circuit 15 and may, in response to the received signals, assert scan control signals and an emission control signal in each row of display pixels 22. Rows of display pixels 22 may be processed in sequence, with processing for each frame of image data starting at the top of the array of display pixels and ending at the bottom of the array (as an example). While the scan lines in a row are being asserted, control signals and data signals that are provided to column driver circuitry 20 by DIC 15 may direct column driver circuitry 20 to demultiplex and drive associated data signals D (e.g., compensated data signals provided by data circuitry 13) onto data lines 26 so that the display pixels in the row will be programmed with the display data appearing on the data lines D. The display pixels can then display the loaded display data.

In an organic light-emitting diode display, each display pixel 22 contains a respective organic light-emitting diode.

Figure 3:
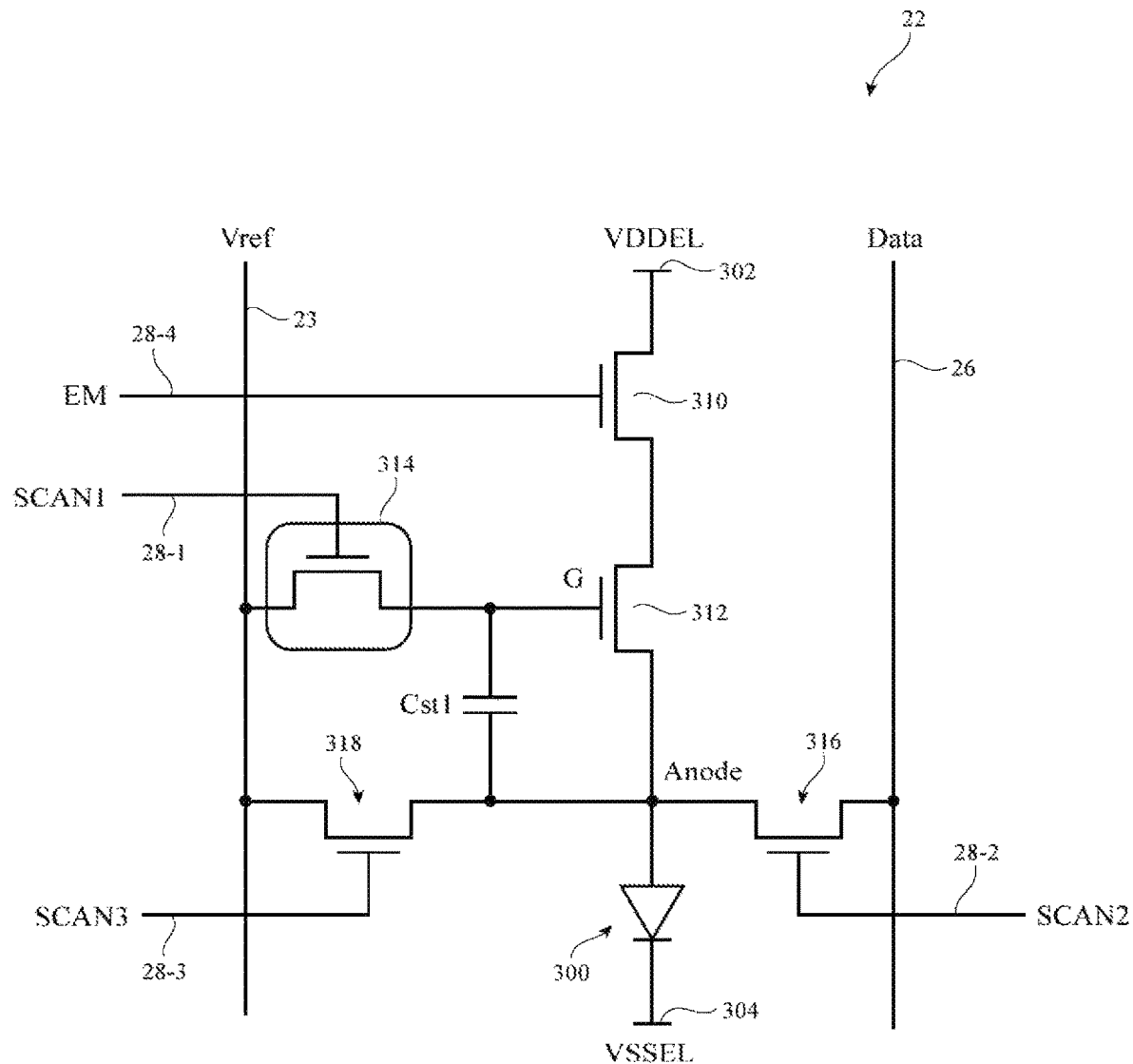
FIG. 3 is a circuit diagram of an illustrative display pixel formed from n-channel thin-film transistors in accordance with an embodiment.

A circuit diagram of an illustrative organic light-emitting diode display pixel 22 that is coupled to compensation circuitry 17 is shown in FIG. 3. As shown in FIG. 3, display pixel 22 may include a light-emitting diode 300, n-channel thin-film transistors 310, 312, 314, 316, and 318, and a storage capacitor Cst1. In particular, transistor 312 is sometimes referred to as the "drive" transistor. Transistors 310 and 312 and diode 300 may be coupled in series between a first power supply line 302 (e.g., a positive power supply line on which positive power supply voltage VDDEL is provided) and a second power supply line 304 (e.g., a ground power supply line on which ground voltage VSSEL is provided). Transistor 310 has a gate terminal that receives an emission control signal EM provided over emission control line 28-4; transistor 310 is therefore sometimes referred to as an emission control transistor. Storage capacitor Cst1 may have first and second terminals that are coupled to gate and source terminals of drive transistor 312, respectively.

Transistor 314 may be coupled between vertical line 23 (e.g., a shared path on which a reference voltage Vref is provided to each pixel 22 along a given column) and the gate (G) of drive transistor 312. Transistor 314 has a gate terminal that receives scan control signal SCAN1 and is selectively turned on to set the gate voltage of drive transistor 312 to a predetermined voltage level (e.g., to voltage level Vref). Transistor 314 is therefore sometimes referred to as a gate voltage setting transistor.

Transistor 316 may be coupled between vertical line 26 (e.g., a data line that is coupled to column driver circuitry 20) and the anode terminal of diode 300. Transistor 316 has a gate terminal that receives scan control signal SCAN2 and is selectively turned on to load a data signal into pixel 22. Transistor 316 is therefore sometimes referred to as a data loading transistor.

Transistor 318 may be coupled between reference voltage line 23 and the anode terminal of the light-emitting diode 300. Transistor 318 has a gate terminal that receives scan control signal SCAN3 and is selectively turned on to reset the anode of diode 300 to reference voltage level Vref. Transistor 318 is therefore sometimes referred to as an anode resetting transistor.

With one suitable arrangement, which is sometimes described herein as an example, the channel region (active region) in some thin-film transistors on display 14 is formed from silicon (e.g., silicon such as polysilicon deposited using a low temperature process, sometimes referred to as "LTPS" or low-temperature polysilicon), whereas the channel region in other thin-film transistors on display 14 is formed from a semiconducting oxide material (e.g., amorphous indium gallium zinc oxide, sometimes referred to as "IGZO"). If desired, other types of semiconductors may be used in forming the thin-film transistors such as amorphous silicon, semiconducting oxides other than IGZO, etc. In a hybrid display configuration of this type, silicon transistors (e.g., LTPS transistors) may be used where attributes such as switching speed and good drive current are desired (e.g., for gate drivers in liquid crystal diode displays or in portions of an organic light-emitting diode display pixel where switching speed is a consideration), whereas oxide transistors (e.g., IGZO transistors) may be used where low leakage current is desired (e.g., in liquid crystal diode display pixels and display driver circuitry) or where high pixel-to-pixel uniformity is desired (e.g., in an array of organic light-emitting diode display pixels). Other considerations may also be taken into account (e.g., considerations related to power consumption, real estate consumption, hysteresis, etc.).

Oxide transistors such as IGZO thin-film transistors are generally n-channel devices (i.e., NMOS transistors). Silicon transistors can be fabricated using p-channel or n-channel designs (i.e., LTPS devices may be either PMOS or NMOS). Combinations of these thin-film transistor structures can provide optimum performance.

In the example of FIG. 3, transistor 314 may be a semiconducting-oxide transistor, while the other transistors 310, 312, 316, and 318 are silicon transistors (e.g., n-channel LTPS transistors). Since the impedance at the gate (G) of drive transistor 312 is high, having semi-conducting oxide transistor 314 being coupled to that node may be advantageous to help reduce leakage and power consumption.

In the arrangement of FIG. 3, not only is data loading performed using line 26, but current sensing can also be performed on data line 26. In other words, sensing circuitry 25 of compensation circuitry 17 shown in FIG. 1 might share the same data lines 26 with the data programming circuitry. If data programming and current sensing were not performed on the same data line 26, it will be necessary to include a separate sensing path for each pixel column (i.e., line 23 will need to also support current sensing), which would substantially increase array routing complexity and area. Thus, performing data programming and current sensing via data lines 26 can help dramatically reduce array routing complexity and area, because a global reference voltage line 23 can be coupled to each pixel column (e.g., reference line 23 might be shared among the different columns in the display pixel array).

Figure 4:
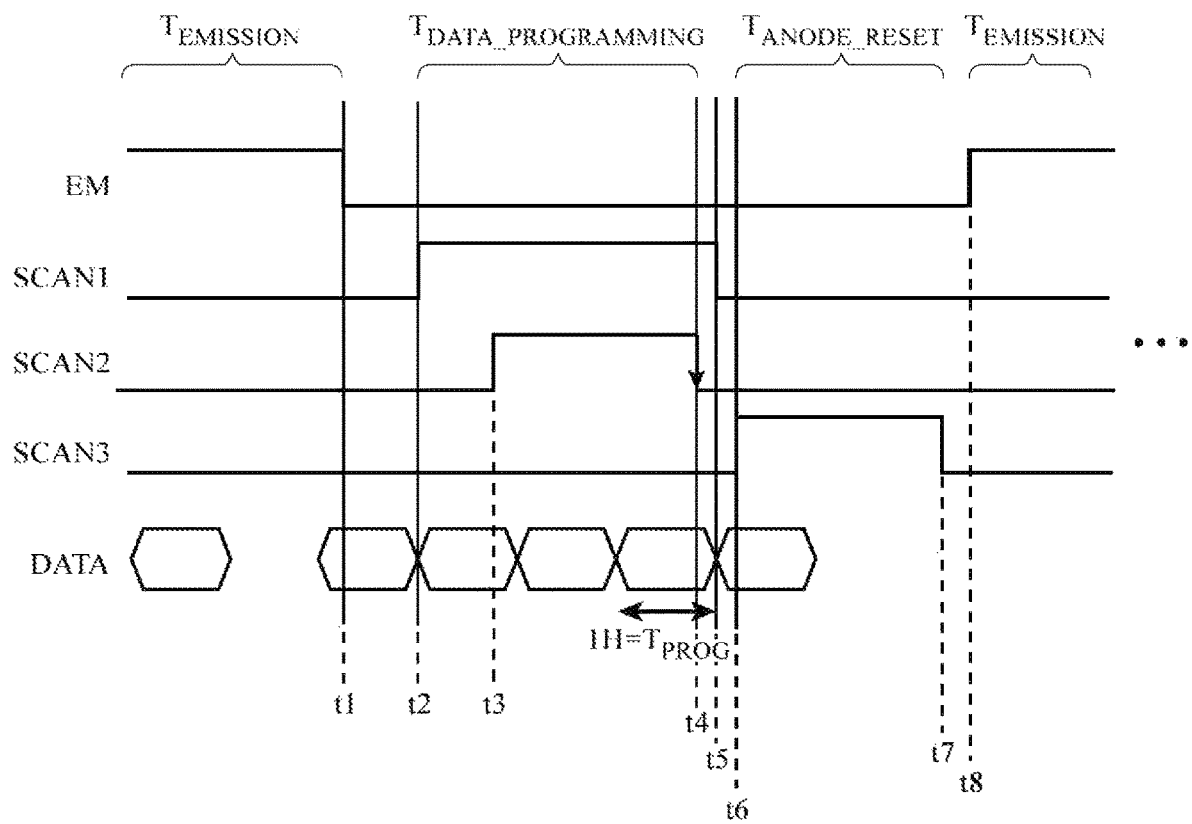
FIG. 4 is a timing diagram illustrating relevant waveforms in operating the display pixel shown in FIG. 3 in accordance with an embodiment.

FIG. 4 is a timing diagram illustrating relevant waveforms in operating display pixel 22 shown in FIG. 3. Prior to time t1, only signal EM is asserted (e.g., emission control signal EM is driven high to logic "1") while all other scan control signals SCAN1, SCAN2, and SCAN3 are deasserted (e.g., the scan control signals are driven low to logic "0") for that row. The period during which signal EM is asserted may be referred to as the emission period $T_{EMISSION}$ or the emission phase.

At time t2, scan signal SCAN1 may be asserted to turn on transistor 314. Activating transistor 314 may allow the gate of drive transistor 312 to be set to the reference voltage level Vref. At time t3, scan signal SCAN2 may be asserted to turn on transistor 316. Activating transistor 316 may allow a data signal presented along line 26 to be loaded into the display pixel (e.g., the data signal may be loaded onto the anode terminal of light-emitting diode 300). The value of the data signal at the falling edge of signal SCAN2 (at time t4) determines what is actually loaded into the display pixel. The period between time t2 and t4 may be referred to as the data programming period $T_{DATA\_PROGRAMMING}$ or the data writing phase. The duration of time that the current data signal should be held constant for that row is indicated as one unit programming time 1H (shown as $T_{PROG}$).

At time t5, signal SCAN1 is deasserted. At this point, the voltage across capacitor Cst1 is fixed (e.g., the voltage stored in Cst1 is equal to the difference between Vref and the programmed data value).

At time t6, only scan signal SCAN3 may be asserted to turn on transistor 318. Activating transistor 318 may allow the anode of light-emitting diode 300 to be reset to reference voltage level Vref. Because transistor 314 is turned off, the voltage across capacitor Cst1 cannot change at this time. Thus, resetting the anode voltage level to Vref will simply shift the gate level of drive transistor 312 up (or down) by the difference between Vref and the data value just loaded into the anode. The gate-to-source voltage of drive transistor 312 should not change. At time t7, scan signal SCAN3 is deasserted. The period between time t6 and t7 may be referred to as the anode reset period $T_{ANODE\_RESET}$ or the anode reset phase. In this example, assertions of scan control signals SCAN1 and SCAN2 are overlapping in time, whereas assertions of scan control signals SCAN1 and SCAN3 are non-overlapping in time.

At time t8, emission control signal EM may be asserted for the emission phase. During the emission phase, current will flow through transistors 310 and 312 and light-emitting diode 300, where the magnitude of the current is dependent on the voltage stored across capacitor Cst1. The amount of current will affect the actual luminance of light that is emitted from diode 300.

Figure 5A:
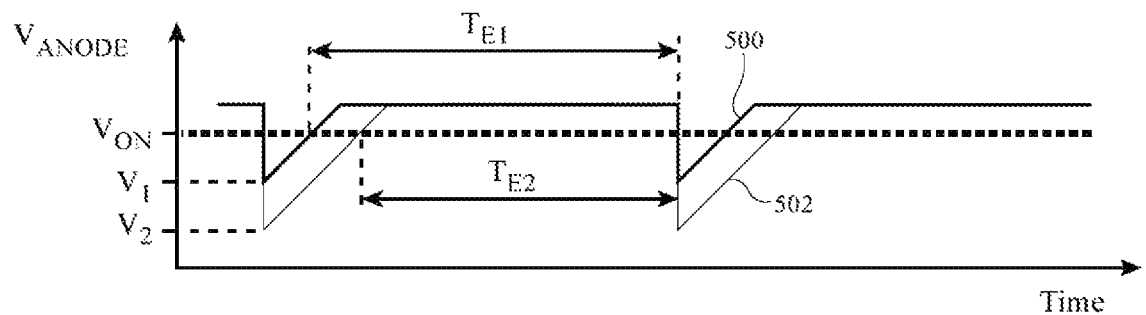
FIGS. 5A and 5B are timing diagrams illustrating how anode reset can help eliminate anode charging non-uniformity issues at low gray levels in accordance with an embodiment.
Figure 5B:
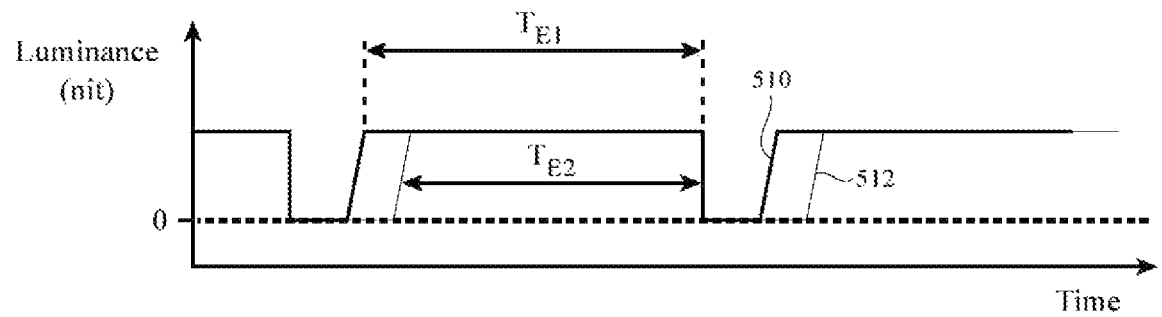

FIGS. 5A and 5B are timing diagrams illustrating how performing anode reset can help eliminate anode charging non-uniformity issues at low gray levels. FIG. 5A plots the anode voltage level as a function of time. Voltage level $V_{ON}$ represents the OLED turn-on voltage threshold. Waveform 500 represents the anode voltage level if the data signal is set to a first gray level V1. Waveform 502 represents the anode voltage level if the data signal is set to a second gray level V2. As shown in FIG. 5A, the voltage of the anode will charge up but will reach threshold $V_{ON}$ at different times. Thus, the emission period $T_{E1}$ associated with waveform 500 and the emission period $T_{E2}$ associated with waveform 502 will be slightly different, resulting in anode charging non-uniformity. FIG. 5B shows how this will negatively impact average brightness levels since the emission periods will be different for pixels with different gray levels. This issue is exacerbated at low gray levels.

In accordance with an embodiment, performing anode reset after data loading and before emission eliminates the low gray non-uniformity issue. Moreover, the anode reset operation can help mimic high frequency refresh rates (e.g., 60 Hz, 120 Hz, etc.) even when the display is only operating at low refresh rates (e.g., 30 Hz or below), thus eliminating low refresh rate flicker and improving variable refresh rate index.

Figure 6A:
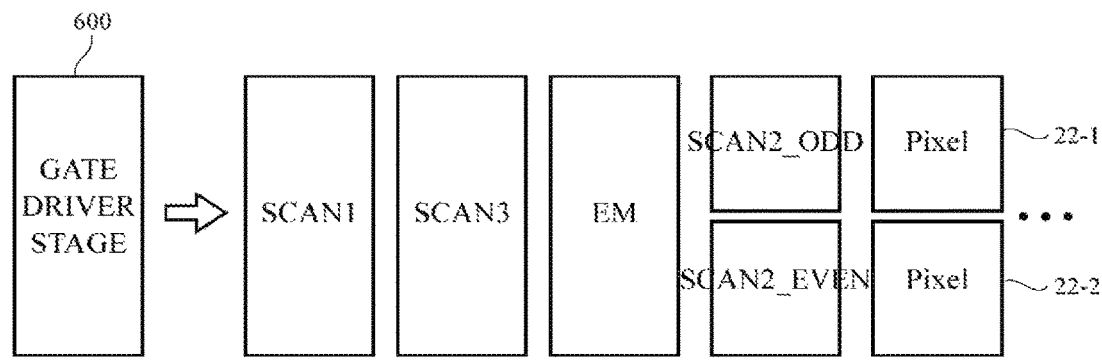
FIG. 6A is a diagram showing how at least some row control lines can be shared between pixels in adjacent rows in accordance with an embodiment.

FIG. 6A is a diagram showing how at least some row control lines can be shared between pixels in adjacent rows. As shown in FIG. 6A, a gate driver stage such as stage 600 may drive row control signals SCAN1, SCAN3, and EM that is shared between pixels 22-1 and 22-2 and other pixels in the two rows and may also drive signal SCAN2_ODD that is fed only to pixel 22-1 and other pixels in the first row and signal SCAN2_EVEN that is fed only to pixel 22-2 and other pixels in the second row. Gate driver stage 600 may represent one stage in a chain of stages in row driver circuitry 18 (see FIG. 2). While signals SCAN1, SCAN3, and EM can be shared among multiple adjacent rows, signal SCAN2 cannot be shared since it controls the data loading (e.g., different pixels need to be loaded with different data signals to maintain full display resolution).

Figure 6B:
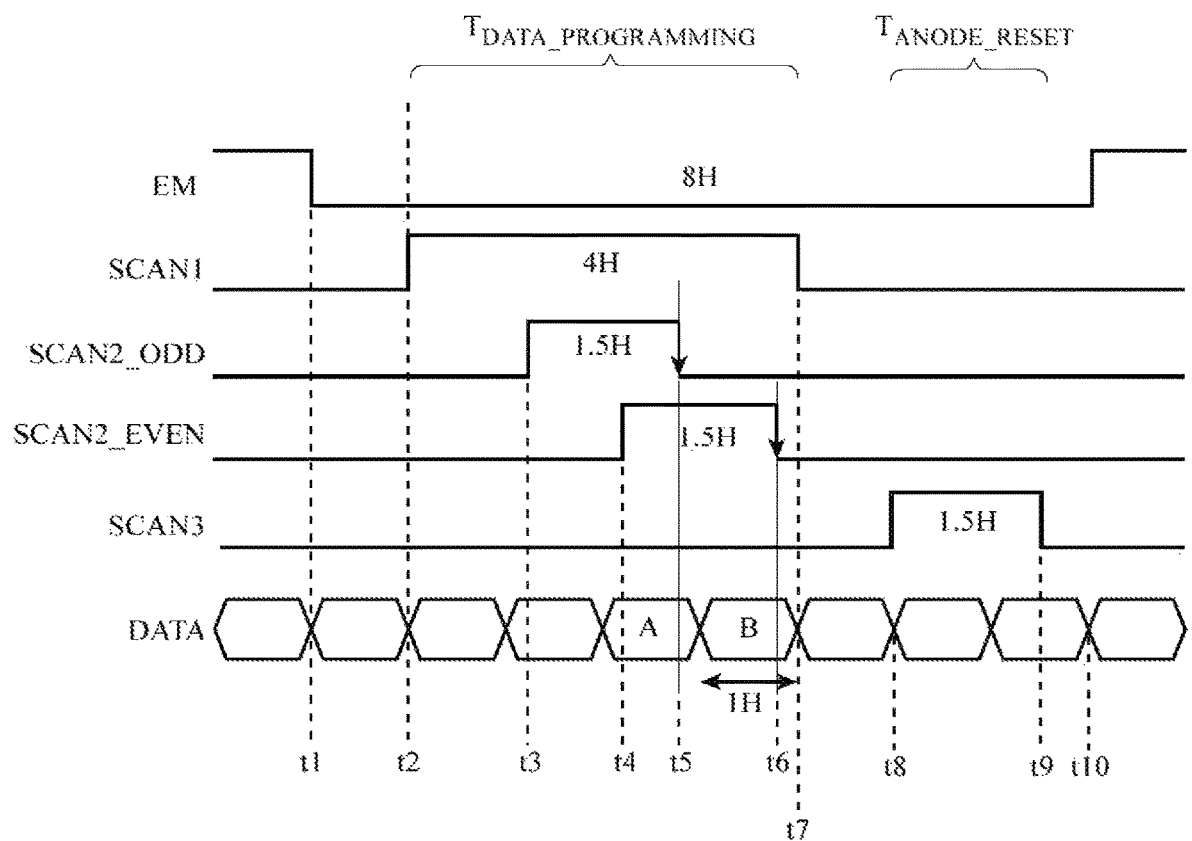
FIG. 6B is a timing diagram illustrating relevant waveforms in operating display pixels with shared row control lines in accordance with an embodiment.

FIG. 6B is a timing diagram illustrating relevant waveforms in operating display pixels with shared row control lines, as shown in configuration of FIG. 6A. Prior to time t1, only signal EM is asserted while all other scan control signals SCAN1, SCAN2_ODD, SCAN2_EVEN, and SCAN3 are deasserted for those two rows.

At time t2, shared scan signal SCAN1 may be asserted to turn on transistor 314 in both pixels 22-1 and 22-2 (see FIG. 6A). At time t3, scan signal SCAN2_ODD may be asserted to turn on transistor 316 in pixel 22-1 (and other pixels along that row). At time t4, scan signal SCAN2_EVEN may be asserted to turn on transistor 316 in pixel 22-2 (and other pixels along that row). At time t5, signal SCAN2_ODD may be deasserted to latch data signal "A" into pixel 22-1. At time t6, signal SCAN2_EVEN may be deasserted to latch data signal "B" into pixel 22-2. At time t7, signal SCAN1 may be deasserted.

At time t8, shared scan signal SCAN3 may be asserted to turn on transistor 318 in both pixels 22-1 and 22-2 to perform the anode reset operation. At time t9, signal SCAN3 may be deasserted. At time t10, shared emission control signal EM may be asserted to start the emission phase. The exemplary timing scheme of FIG. 6B in which the emission period is 8H in duration (i.e., eight times the unit data programming period), the SCAN1 period is 4H, and the SCAN2 and SCAN3 periods are 1.5H is merely illustrative and does not serve to limit the scope of the present embodiment. If desired, these periods can be lengthened or shorted and shifted forward or backward in time, so long as data programming and anode reset is properly performed. In general, the sharing of row control lines may be extended to any number of adjacent rows (e.g., row control lines may be shared among three or more rows, four or more rows, five or more rows, etc.).

Figure 7:
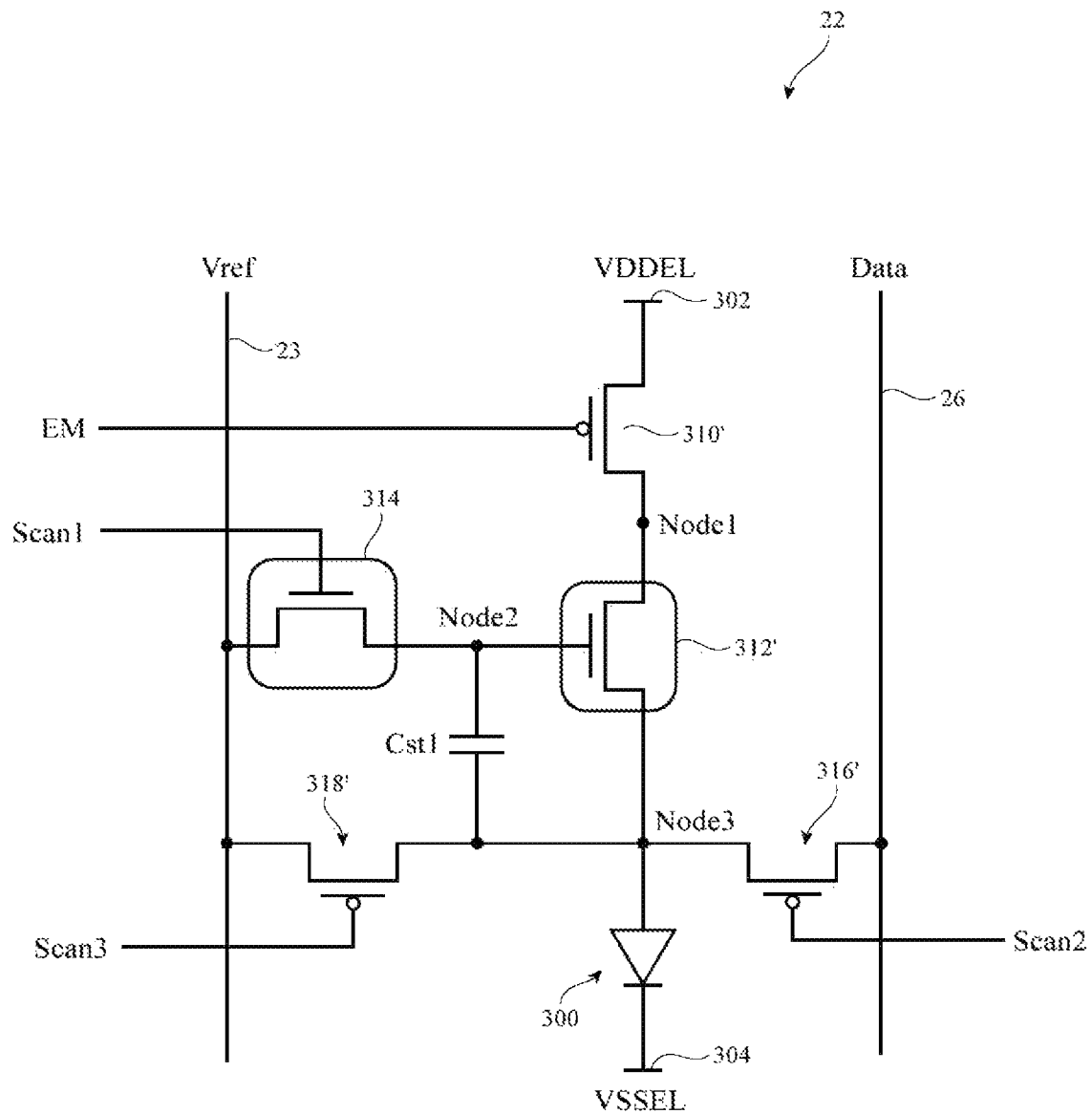
FIG. 7 is a circuit diagram of an illustrative display pixel formed from n-channel semiconducting-oxide transistors and p-channel silicon transistors in accordance with an embodiment.

FIG. 7 shows another suitable arrangement in which pixel 22 includes n-channel semiconducting-oxide transistors and p-channel silicon transistors, where pixel 22 may be coupled to compensation circuitry 17 of FIG. 2. As shown in FIG. 7, display pixel 22 may include a light-emitting diode 300, n-channel thin-film transistors 312' and 314, p-channel thin-film transistors 310', 316', and 318', and storage capacitor Cst1. Transistor 312' may be referred to as the "drive" transistor. Transistors 310' and 312' and diode 300 may be coupled in series between first power supply line 302 and second power supply line 304. Transistor 310' has a gate terminal that receives emission control signal EM. Storage capacitor Cst1 may have first and second terminals that are coupled to gate and source terminals of drive transistor 312', respectively.

Transistor 314 may be coupled between reference line 23 and the gate (G) terminal of drive transistor 312'. Transistor 314 has a gate terminal that receives scan control signal SCAN1 and is selectively turned on to set the gate voltage of drive transistor 312' to predetermined voltage level Vref. Transistor 316' may be coupled between column line 26 and the anode terminal of diode 300. Transistor 316' has a gate terminal that receives scan control signal SCAN2 and is selectively turned on to pass a data signal into pixel 22. Transistor 318' may be coupled between reference voltage line 23 and the anode terminal of light-emitting diode 300. Transistor 318' has a gate terminal that receives scan control signal SCAN3 and is selectively turned on to reset the anode of diode 300 to reference voltage level Vref.

In the example of FIG. 7, transistors 314 and 312' may be a semiconducting-oxide transistors, while the other transistors 310', 316', and 318' are silicon transistors (e.g., p-channel LTPS transistors). Since the impedance at the gate (G) of drive transistor 312' is high, having semi-conducting oxide transistor 314 being coupled to that node may be advantageous to help reduce leakage and power consumption. The drive transistor is typically n-type, so it may be advantageous to keep transistor 312' as a semiconducting-oxide transistor to simplify fabrication (e.g., forming drive transistor 312' as an n-type LTPS transistor would necessarily increase the number of lithographic masks and thus increase manufacturing cost). In the arrangement of FIG. 7, data programming and current sensing are also both perform on data lines 26, which can help dramatically reduce array routing complexity and area.

Figure 8:
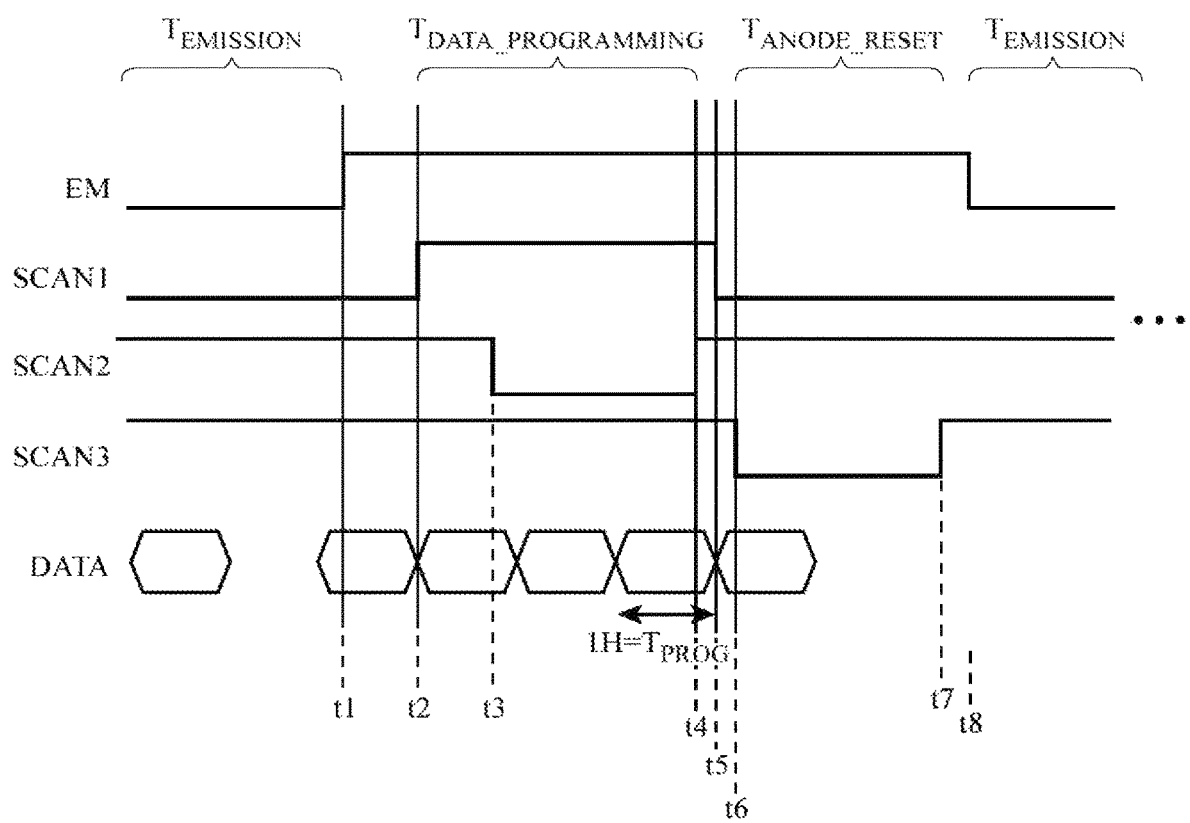
FIG. 8 is a timing diagram illustrating relevant waveforms in operating the display pixel shown in FIG. 7 in accordance with an embodiment.

FIG. 8 is a timing diagram illustrating relevant waveforms in operating display pixel 22 shown in FIG. 7. Since transistors 310', 316' and 318' are now p-channel transistors, the corresponding control signals EM, SCAN2, and SCAN3 are active-low signals (i.e., assertion implies that these signals be driven to logic "0"). Prior to time t1, only signal EM is asserted (e.g., emission control signal EM is driven low to logic "0") while all other scan control signals SCAN1, SCAN2, and SCAN3 are deasserted (e.g., signals SCAN2 and SCAN3 are driven high to logic "1" and signal SCAN1 is driven low to logic "0") for that row. The period during which signal EM is asserted may be referred to as the emission period $T_{EMISSION}$ or the emission phase.

At time t2, scan signal SCAN1 may be asserted (e.g., driven high) to turn on transistor 314. Activating transistor 314 may allow the gate of drive transistor 312' to be set to the reference voltage level Vref. At time t3, scan signal SCAN2 may be asserted (e.g., driven low) to turn on transistor 316'. Activating transistor 316' may allow a data signal presented along line 26 to be loaded into the display pixel (e.g., the data signal may be loaded onto the anode terminal of light-emitting diode 300). The value of the data signal at the falling edge of signal SCAN2 (at time t4) determines what is actually loaded into the display pixel. The period between time t2 and t4 may be referred to as the data programming period $T_{DATA\_PROGRAMMING}$ or the data writing phase. The duration of time that the current data signal should be held constant for that row is indicated as one unit programming time 1H (shown as $T_{PROG}$).

At time t5, signal SCAN1 is deasserted. At this point, the voltage across capacitor Cst1 is fixed (e.g., the voltage stored in Cst1 is equal to the difference between Vref and the programmed data value).

At time t6, only scan signal SCAN3 may be asserted (e.g., driven low) to turn on transistor 318'. Activating transistor 318' may allow the anode of light-emitting diode 300 to be reset to reference voltage level Vref. Because transistor 314 is turned off, the voltage across capacitor Cst1 cannot change at this time. Thus, resetting the anode voltage level to Vref will simply shift the gate level of drive transistor 312' up (or down) by the difference between Vref and the data value just loaded into the anode. The gate-to-source voltage of drive transistor 312' should not change. At time t7, scan signal SCAN3 is deasserted. The period between time t6 and t7 may be referred to as the anode reset period $T_{ANODE\_RESET}$ or the anode reset phase. In this example, assertions of scan control signals SCAN1 and SCAN2 are overlapping in time, whereas assertions of scan control signals SCAN1 and SCAN3 are non-overlapping in time.

At time t8, emission control signal EM may be asserted for the emission phase. During the emission phase, current will flow through transistors 310' and 312' and light-emitting diode 300, where the magnitude of the current is dependent on the voltage stored across capacitor Cst1. The amount of current will affect the actual luminance of light that is emitted from diode 300.

Configured in this way, pixel 22 of FIG. 7 that is capable of performing anode reset after data loading and before emission eliminates the low gray non-uniformity issue. Moreover, the anode reset operation can help mimic high frequency refresh rates (e.g., 60 Hz, 120 Hz, etc.) even when the display is only operating at low refresh rates (e.g., 30 Hz or below), thus eliminating low refresh rate flicker and improving variable refresh rate index.

Figure 9A:
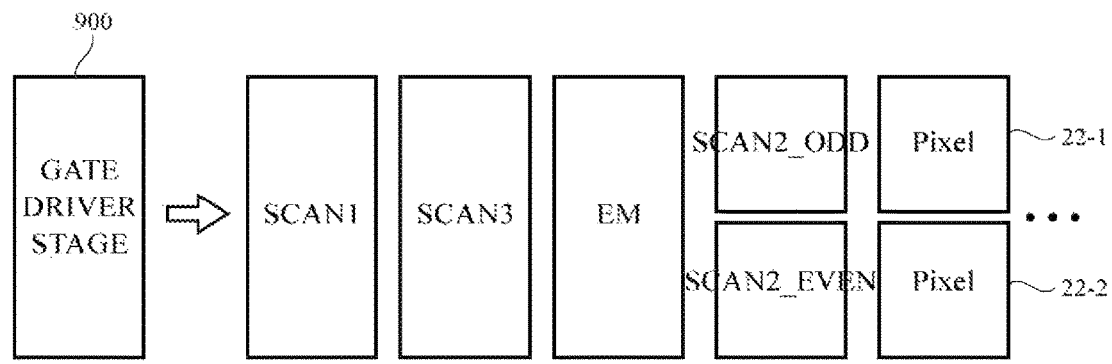
FIG. 9A is a diagram showing how at least some row control lines can be shared between adjacent pixels of the type shown in FIG. 7 in accordance with an embodiment.

FIG. 9A is a diagram showing how at least some row control lines can be shared between pixels in adjacent rows. As shown in FIG. 9A, a gate driver stage such as stage 900 may drive row control signals SCAN1, SCAN3, and EM that is shared between pixels 22-1 and 22-2 and other pixels in the two rows and may also drive signal SCAN2_ODD that is fed only to pixel 22-1 (and other pixels in the first row) and signal SCAN2_EVEN that is fed only to pixel 22-2 (and other pixels in the second row). Gate driver stage 900 may represent one stage in a chain of stages in row driver circuitry 18 (see FIG. 2). While signals SCAN1, SCAN3, and EM can be shared among multiple adjacent rows, signal SCAN2 cannot be shared since it controls the data loading (e.g., different pixels need to be loaded with different data signals to maintain full display resolution).

Figure 9B:
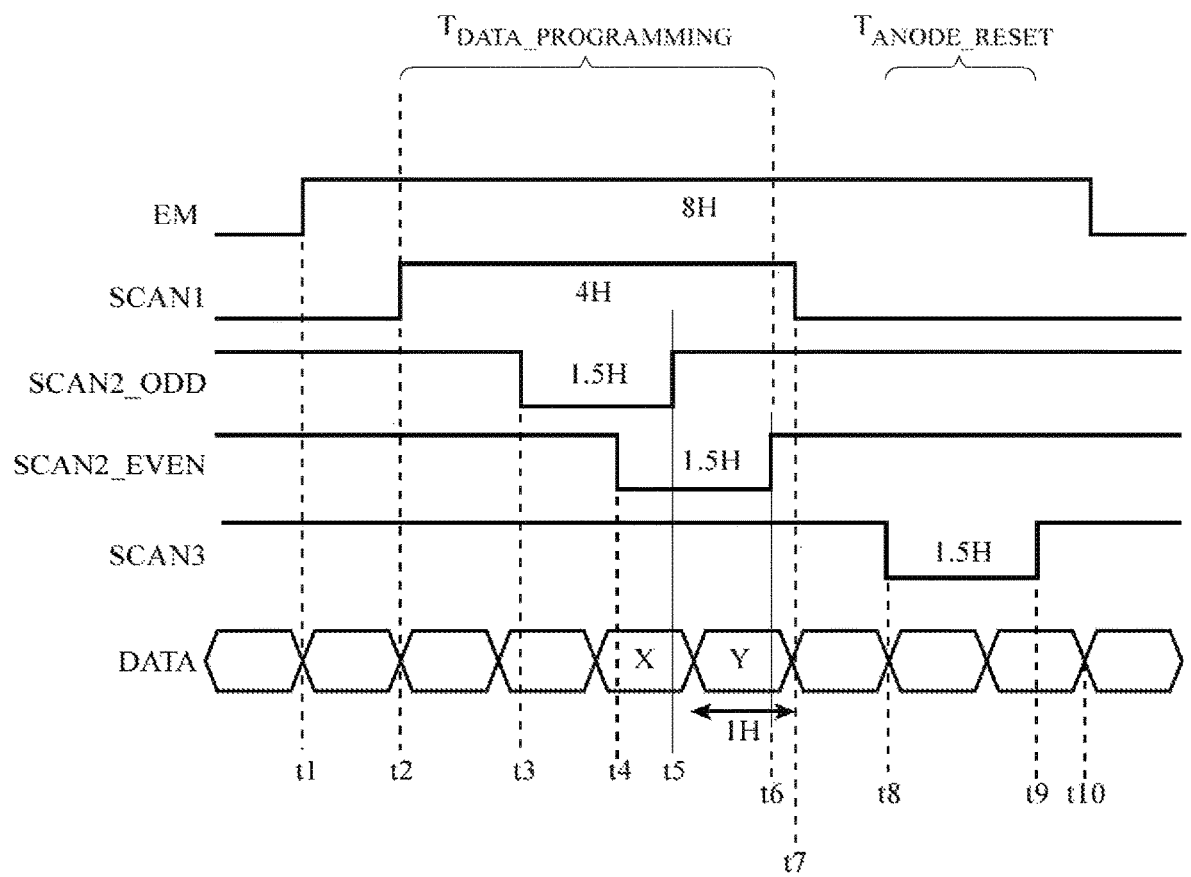
FIG. 9B is a timing diagram illustrating relevant waveforms in operating the display pixels shown in FIG. 9A in accordance with an embodiment.

FIG. 9B is a timing diagram illustrating relevant waveforms in operating display pixels with shared row control lines, as shown in configuration of FIG. 9A. Prior to time t1, only signal EM is asserted (e.g., driven low to logic "1") while all other scan control signals SCAN1, SCAN2_ODD, SCAN2_EVEN, and SCAN3 are deasserted for those two rows (e.g., active-high signal SCAN1 is driven low to logic "0" while active-low signals SCAN2_ODD, SCAN2_EVEN, and SCAN3 are driven high to logic "1").

At time t2, shared scan signal SCAN1 may be asserted to turn on transistor 314 in both pixels 22-1 and 22-2 (see FIG. 9A). At time t3, scan signal SCAN2_ODD may be asserted to turn on transistor 316' in pixel 22-1 (and other pixels along that row). At time t4, scan signal SCAN2_EVEN may be asserted to turn on transistor 316' in pixel 22-2 (and other pixels along that row). At time t5, signal SCAN2_ODD may be deasserted to latch data signal "X" into pixel 22-1. At time t6, signal SCAN2_EVEN may be deasserted to latch data signal "Y" into pixel 22-2. At time t7, signal SCAN1 may be deasserted.

At time t8, shared scan signal SCAN3 may be asserted to turn on transistor 318 in both pixels 22-1 and 22-2 to perform the anode reset operation. At time t9, signal SCAN3 may be deasserted. At time t10, shared emission control signal EM may be asserted to start the emission phase. The exemplary timing scheme of FIG. 9B in which the emission period is 8H in duration (i.e., eight times the unit data programming period), the SCAN1 period is 4H, and the SCAN2 and SCAN3 periods are 1.5H is merely illustrative and does not serve to limit the scope of the present embodiment. If desired, these periods can be lengthened or shorted and shifted forward or backward in time, so long as data programming and anode reset is properly performed. In general, the sharing of row control lines may be extended to any number of adjacent rows (e.g., row control lines may be shared among three or more rows, four or more rows, five or more rows, etc.).

Figure 10:
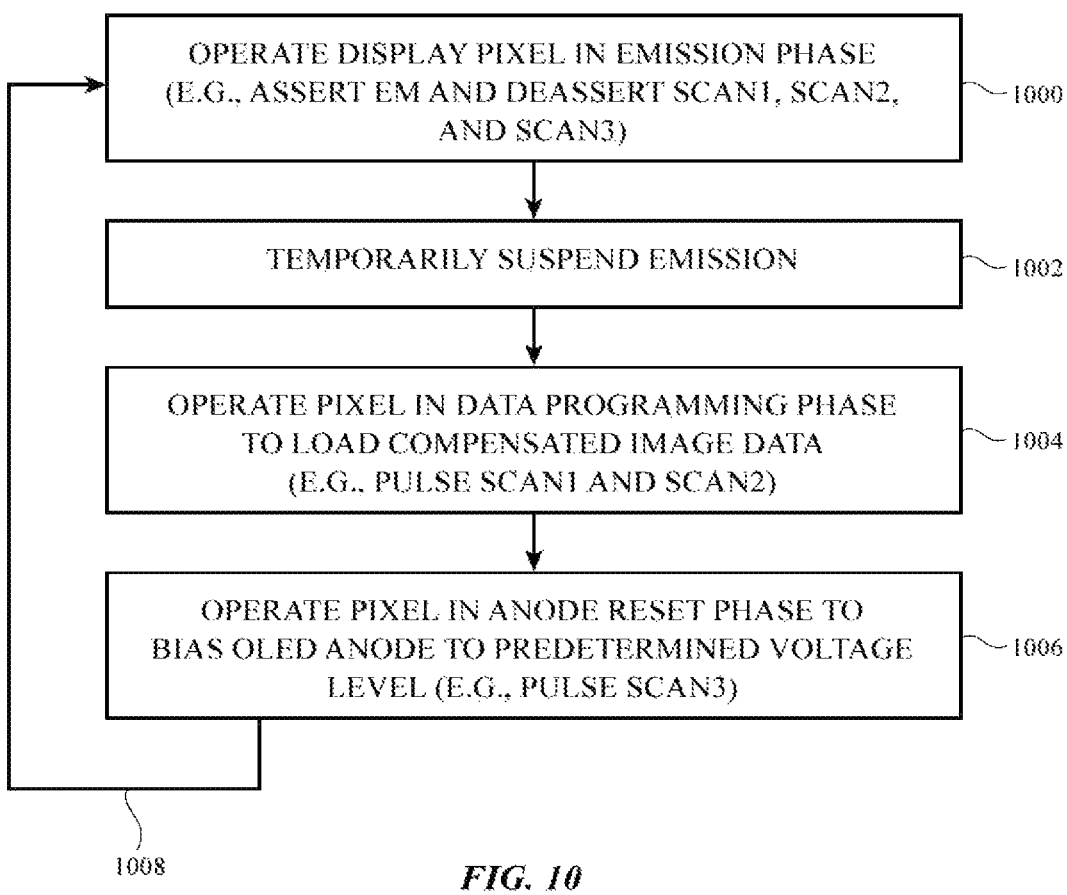
FIG. 10 is a flow chart of illustrative steps for operating a display pixel of the type shown in connection with FIGS. 2-9 in accordance with at least some embodiments.

FIG. 10 is a flow chart of illustrative steps for operating a display pixel of the type shown in connection with FIGS. 2-9 in accordance with at least some embodiments. At step 1000, display pixel 22 may be operated in the emission phase (e.g., by asserting emission control signal EM to allow current to flow through the drive transistor to the OLED while deasserting the scan control signals SCAN1, SCAN2, and SCAN3).

At step 1002, the emission phase may be temporarily suspended (e.g., by temporarily deasserting emission control signal EM to prevent current from flowing through the drive transistor to the OLED).

At step 1004, pixel 22 may be operated in the data programming phase to load compensated image data into the anode terminal (e.g., by pulsing signals SCAN1 and SCAN2 to set the voltage level at the gate terminal of the drive transistor and to load in the compensated data value to the anode terminal, respectively).

At step 1006, pixel 22 may be operated in the anode reset phase so that the anode of the OLED is biased to a predetermined reset/reference voltage level (e.g., by pulsing scan signal SCAN3). Performing anode reset in this way can help eliminate the low gray non-uniformity issues, eliminate low refresh rate flicker, and improve variable refresh rate index. Processing may loop back to step 1000 for successive rows in the display pixel array, as indicated by path 1008.

The exemplary pixel architectures shown in FIGS. 3 and 7 that include five transistors, one capacitor, one emission control line, and three scan control lines are merely illustrative. If desired, the techniques described herein may be extended or applied to pixel structures that include any number of oxide or silicon transistors, any number of capacitors, more than one emission line, less than three scan control lines or more than three scan control lines, and other suitable display pixel architectures.

The foregoing is merely illustrative and various modifications can be made by those skilled in the art without departing from the scope and spirit of the described embodiments. The foregoing embodiments may be implemented individually or in any combination.

What is claimed is:
1. A display pixel comprising:
a light-emitting diode;
a drive transistor coupled in series with the light-emitting diode;
a data loading transistor for loading data into the display pixel;
a voltage line;
an anode reset transistor connected between the voltage line and the light-emitting diode; and
a semiconducting-oxide transistor connected between the voltage line and a gate terminal of the drive transistor, wherein the anode reset transistor and the semiconducting-oxide transistor comprise different types of thin-film transistors.

2. The display pixel of claim 1, wherein the data loading transistor and the semiconducting-oxide transistor also comprise different types of thin-film transistors.

3. The display pixel of claim 1, wherein the anode reset transistor is directly connected to the light-emitting diode.

4. The display pixel of claim 1, wherein the display pixel includes only two semiconducting-oxide transistors.

5. The display pixel of claim 1, wherein the data loading transistor and the anode reset transistor are p-type silicon transistors.

6. The display pixel of claim 1, wherein the display pixel further comprises:
an emission transistor coupled in series with the drive transistor and the light-emitting diode, wherein the emission transistor and the drive transistor are the same type of thin-film transistors.

7. The display pixel of claim 6, wherein the drive transistor and the emission transistor are silicon transistors.

8. The display pixel of claim 7, wherein the display pixel comprises only transistors selected from the group consisting of: semiconducting-oxide transistors and p-type silicon transistors.

9. The display pixel of claim 1, wherein the data loading transistor is a p-type silicon transistor directly connected to the drive transistor.

10. The display pixel of claim 5, further comprising:
a storage capacitor coupled to the gate terminal of the drive transistor.

11. The display pixel of claim 5, further comprising:
a first control line configured to provide a first control signal to the semiconducting-oxide transistor;

a second control line that is different than the first control line and that is configured to provide a second control signal to the data loading transistor; and a third control line that is different than the first and second control line and that is configured to provide a third control signal to the anode reset transistor.

12. A method for operating a display pixel that comprises a light-emitting diode, a drive transistor, a gate voltage setting transistor, a data loading transistor, and an anode resetting transistor, the method comprising:

with the data loading transistor, loading data onto the light-emitting diode;

with the gate voltage setting transistor, receiving a first scan control signal;

with the anode resetting transistor, receiving a second scan control signal that is different than the first scan control signal and resetting the light-emitting diode; and with the drive transistor, driving current through the light-emitting diode.

13. The method of claim 12, wherein resetting the gate voltage setting transistor is a semiconducting-oxide transistor.

14. The method of claim 12, wherein the display pixel comprises only two semiconducting-oxide transistors.

15. The method of claim 12, wherein the display pixel further comprises an emission control transistor, the method further comprising:

with the emission control transistor, receiving an emission control signal; and with the data loading transistor, receiving a third scan control signal that is different than the first and second scan control signals.

16. The method of claim 15, wherein assertions of the first and third scan control signals are overlapping in time, and wherein assertions of the first and second scan control signals are non-overlapping in time.

17. An electronic device comprising:
a first display pixel in a first row;
a second display pixel in a second row; and
a gate driver stage that outputs a first scan signal to the first and second display pixels, a second odd scan signal to the first display pixel but not the second display pixel, and a second even scan signal to the second display pixel but not the first display pixel.

18. The electronic device of claim 17, wherein the gate driver stage is further configured to output a third scan signal and an emission control signal to the first and second display pixels.

19. The electronic device of claim 18, wherein the first and second rows are adjacent rows in an array.

20. The electronic device of claim 18, wherein the first display pixel comprises:

an emission transistor that receives the emission control signal;

a drive transistor coupled in series with the emission transistor, the drive transistor having a gate terminal;

a light-emitting diode coupled in series with the emission transistor and the drive transistor, the light-emitting diode having an anode terminal;

a reference voltage line;

a gate voltage setting transistor coupled between the reference voltage line and the gate terminal of the drive transistor, the gate voltage setting transistor receives the first scan signal;

a data line;

a data loading transistor coupled between the data line and the anode terminal of the light-emitting diode, the data loading transistor receives the second odd scan signal; and an anode resetting transistor coupled between the reference voltage line and the anode terminal of the light-emitting diode, the anode resetting transistor receives the third scan signal.

* * * * *